United States Patent
He

(10) Patent No.: US 11,637,133 B2
(45) Date of Patent: Apr. 25, 2023

(54) ARRAY SUBSTRATE AND METHOD OF MANUFACTURING SAME

(71) Applicant: TCL China Star Optoelectronics Technology Co., Ltd., Shenzhen (CN)

(72) Inventor: Hui He, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/622,924

(22) PCT Filed: Nov. 25, 2019

(86) PCT No.: PCT/CN2019/120484
§ 371 (c)(1),
(2) Date: Dec. 16, 2019

(87) PCT Pub. No.: WO2021/093010
PCT Pub. Date: May 20, 2021

(65) Prior Publication Data
US 2022/0271065 A1    Aug. 25, 2022

(30) Foreign Application Priority Data
Nov. 13, 2019 (CN) .......................... 201911107533.9

(51) Int. Cl.
*H01L 27/00* (2006.01)
*H01L 29/00* (2006.01)
*H01L 27/12* (2006.01)

(52) U.S. Cl.
CPC ........ *H01L 27/1248* (2013.01); *H01L 27/127* (2013.01)

(58) Field of Classification Search
CPC ............... H01L 27/1248; H01L 27/127; H01L 27/3278; H01L 27/3227; H01L 27/1222; H01L 27/32; H01L 27/3244; H01L 27/124; H01L 29/78633; H01L 29/78696; H01L 29/78669
See application file for complete search history.

(56) References Cited

U.S. PATENT DOCUMENTS

| 6,927,809 B2* | 8/2005 | Gotoh | H01L 29/78633 |
| | | | 257/E27.113 |
| 8,598,583 B2* | 12/2013 | Ryu | H01L 27/1225 |
| | | | 257/E29.273 |
| 10,331,253 B2* | 6/2019 | Huang | G02F 1/133514 |

(Continued)

FOREIGN PATENT DOCUMENTS

CN    103337497 A    10/2013
CN    106684103 A    5/2017

*Primary Examiner* — Nikolay K Yushin
(74) *Attorney, Agent, or Firm* — Nathan & Associates; Menachem Nathan

(57) ABSTRACT

An array substrate and a method of manufacturing the same are provided. The array substrate includes an active island and a gate insulating layer, a gate, and an interlayer dielectric layer stacked on the active island. A color resist layer is disposed on the interlayer dielectric layer, and an orthographic projection of the color resist layer on a base substrate covers an orthographic projection of a channel region of the active island on the base substrate.

10 Claims, 6 Drawing Sheets

(56) References Cited

U.S. PATENT DOCUMENTS

| | | | |
|---|---|---|---|
| 2004/0257489 A1* | 12/2004 | Gotoh | G02F 1/136209 |
| | | | 257/E27.113 |
| 2008/0259051 A1* | 10/2008 | Ota | G06F 3/042 |
| | | | 345/175 |
| 2010/0149464 A1 | 6/2010 | Han et al. | |
| 2011/0180798 A1 | 7/2011 | Shim et al. | |
| 2011/0272696 A1* | 11/2011 | Ryu | H01L 27/1248 |
| | | | 438/164 |
| 2018/0157127 A1* | 6/2018 | Ye | G02F 1/13394 |
| 2019/0004641 A1* | 1/2019 | Huang | G02F 1/133514 |

* cited by examiner

ARRAY SUBSTRATE AND METHOD OF MANUFACTURING SAME

CROSS-REFERENCE TO RELATED APPLICATION

This application claims the priority of Chinese Application No. 201911107533.9 filed on Nov. 13, 2019 and titled "ARRAY SUBSTRATE AND METHOD OF MANUFACTURING SAME", which is incorporated herein by reference in its entirety.

FIELD OF INVENTION

The present disclosure relates to the field of display technologies, and more particularly to an array substrate and a method of manufacturing the same.

BACKGROUND OF INVENTION

In a top-gate indium gallium zinc oxide (IGZO) semiconductor array substrate, after forming an active island, subsequent films need to be processed with light for subsequent processes. The active island is easily irradiated by the light, and a channel region of the active island is seriously affected by the light, which results in a large impact on performance of a thin film transistor (TFT) device.

SUMMARY OF INVENTION

An embodiment of the present application provides an array substrate, comprising: a base substrate; an active island disposed on the base substrate; a gate insulating layer disposed on the active island; a gate disposed on the gate insulating layer; an interlayer dielectric layer covering the active island, the gate insulating layer, and the gate; a source/drain disposed on the interlayer dielectric layer and a passivation layer covering the source/drain; wherein the source/drain is in contact with the active island through a via hole on the interlayer dielectric layer; a planarization layer disposed on the passivation layer; and a metal anode disposed on the planarization layer and electrically connected to the source/drain; wherein the active island comprises a channel region corresponding to the gate, and the interlayer dielectric layer is further provided with a color resist layer disposed thereon, and an orthographic projection of the color resist layer on the base substrate covers an orthographic projection of the channel region of the active island on the base substrate.

In an embodiment of the present application, the array substrate has a display area, the color resist layer comprises a color resist block located in the display area and a light blocking layer located above the active island, and an orthographic projection of the light blocking layer on the base substrate covers the orthographic projection of the channel region on the base substrate.

In an embodiment of the present application, the light blocking layer comprises a first color resist material layer and a second color resist material layer which are arranged in a stack, and a color corresponding to the first color resist material layer is one of red, green, and blue, and a color corresponding to the second color resist material layer is another one of red, green, and blue.

In an embodiment of the present application, a thickness of the light blocking layer is same as a thickness of the color resist block.

In an embodiment of the present application, the planarization layer covers the light blocking layer, a first via hole is provided on the planarization layer at a position corresponding to the source/drain, the light blocking layer is provided with a second via hole communicating with the first via hole, the passivation layer is provided with a third via hole communicating with the second via hole and extending to a surface of the source/drain, and the metal anode contacts the source/drain through the first via hole, the second via hole, and the third via hole.

In an embodiment of the present application, a diameter of the second via hole is greater than a diameter of the first via hole.

An embodiment of the present application, an array substrate, comprising: a base substrate; an active island disposed on the base substrate; a gate insulating layer disposed on the active island; a gate disposed on the gate insulating layer; an interlayer dielectric layer covering the active island, the gate insulating layer, and the gate; a source/drain disposed on the interlayer dielectric layer and a passivation layer covering the source/drain; a planarization layer disposed on the passivation layer; and a metal anode disposed on the planarization layer and electrically connected to the source/drain; wherein the active island comprises a channel region corresponding to the gate, and the interlayer dielectric layer is further provided with a color resist layer disposed thereon, and an orthographic projection of the color resist layer on the base substrate covers an orthographic projection of the channel region of the active island on the base substrate.

In an embodiment of the present application, the array substrate has a display area, the color resist layer comprises a color resist block located in the display area and a light blocking layer located above the active island, and an orthographic projection of the light blocking layer on the base substrate covers the orthographic projection of the channel region on the base substrate.

In an embodiment of the present application, the light blocking layer comprises a first color resist material layer and a second color resist material layer which are arranged in a stack, and a color corresponding to the first color resist material layer is one of red, green, and blue, and a color corresponding to the second color resist material layer is another one of red, green, and blue.

In an embodiment of the present application, a thickness of the light blocking layer is same as a thickness of the color resist block.

In an embodiment of the present application, the planarization layer covers the light blocking layer, a first via hole is provided on the planarization layer at a position corresponding to the source/drain, the light blocking layer is provided with a second via hole communicating with the first via hole, the passivation layer is provided with a third via hole communicating with the second via hole and extending to a surface of the source/drain, and the metal anode contacts the source/drain through the first via hole, the second via hole, and the third via hole.

In an embodiment of the present application, a diameter of the second via hole is greater than a diameter of the first via hole.

An embodiment of the present application further provides a method of manufacturing an array substrate, comprising following steps: S10, forming an active island on a base substrate; S20, forming a gate insulating layer on the active island; S30, forming a gate on the gate insulating layer; S40, forming an interlayer dielectric layer covering the active island, the gate insulating layer, and the gate on the base substrate; S50, forming a source/drain on the interlayer dielectric layer; S60, forming a passivation layer covering the source/drain on the interlayer dielectric layer; S70, forming a color resist layer on the passivation layer and performing a patterning treatment on the color resist layer; S80, forming a planarization layer on the passivation layer; and S90, forming a metal anode electrically connected to the source/drain on the planarization layer; wherein an orthographic projection of the color resist layer on the base substrate covers an orthographic projection of the channel region of the active island on the base substrate.

In an embodiment of the present application, the step S80 comprises: S81, forming a whole layer of the color resist layer on the passivation layer; S82, covering the color resist layer with a photomask and exposing the color resist layer; and S83, etching the color resist layer to form a color resist block located in the display area and a light blocking layer above the active island, wherein an orthographic projection of the light blocking layer on the base substrate covers the orthographic projection of the channel region of the active island on the base substrate.

In an embodiment of the present application, in the step S83, when the color resist block and the light blocking layer are formed, a second via hole located on the light blocking layer is simultaneously formed.

In an embodiment of the present application, when the color resist layer is covered by the photomask, a first portion of the photomask corresponds to the light blocking layer, a second portion of the photomask corresponds to the color resist block, a third portion of the photomask corresponds to a second via hole, light transmittance of the first portion is greater than 0 and less than light transmittance of the second portion, and light transmittance of the third portion is 0.

Beneficial effects of the present application are that: the color resist layer is used to shield a channel of the active island. While the color resist layer plays a normal role of blocking and filtering, it can effectively prevent light from shining on the channel region of the active island in subsequent processes and lighting tests, so as to avoid adversely affecting performance of a TFT device, device stability and process stability are improved.

Figure 1:
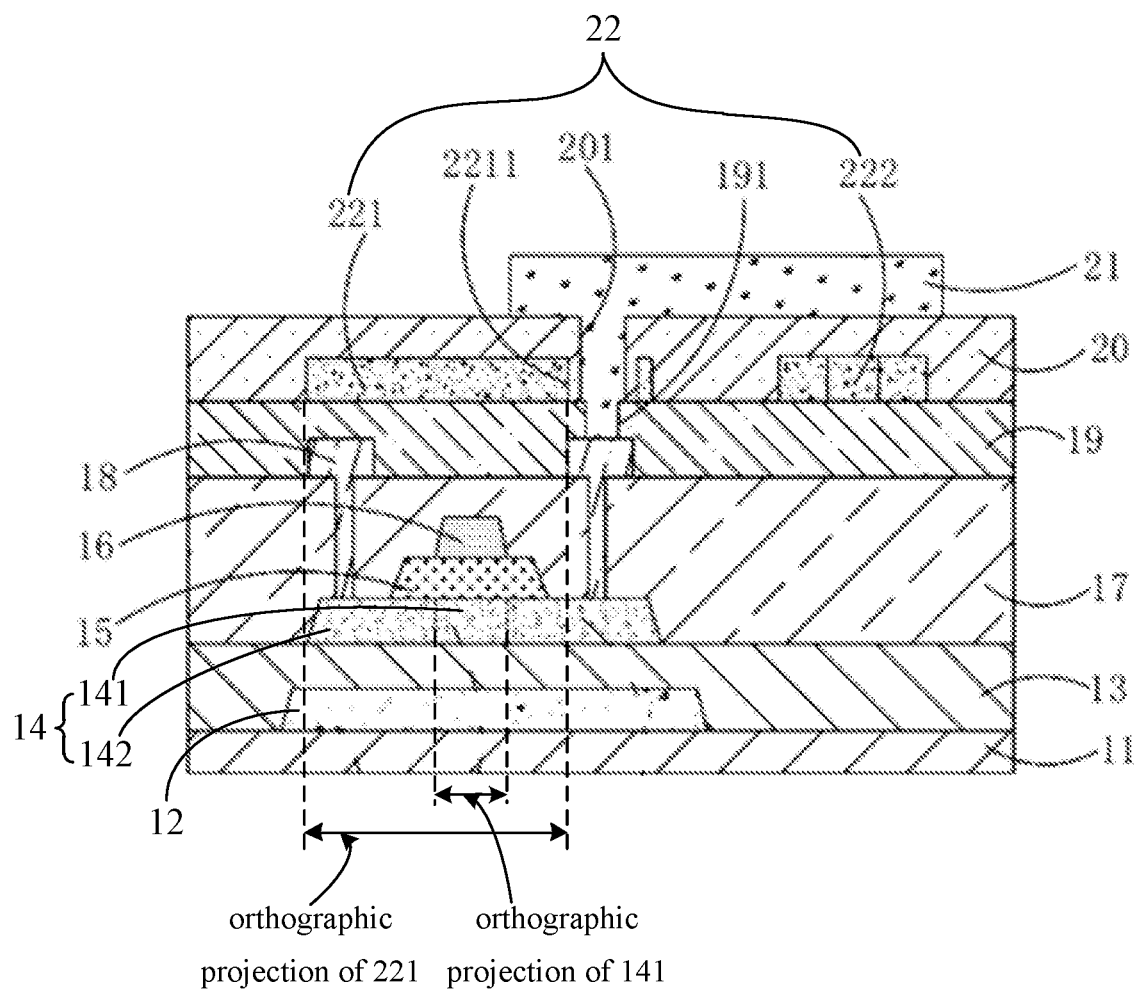
FIG. 1 is a schematic structural diagram of an array substrate according to an embodiment of the present invention.

11 substrate; 12 light shielding layer; 13 buffer layer; 14 active island; 141 channel region; 142 ion-doped region; 15 gate insulating layer; 16 gate; 17 interlayer dielectric layer; 18 source/drain; 19 passivation layer; 191 third via hole; 20 planarization layer; 201 first via hole; 21 metal anode; 2211 second via hole; 222 color resist block; 23 photomask; 231 first portion; 232 second portion; 233 third portion

DETAILED DESCRIPTION OF PREFERRED EMBODIMENTS

The following descriptions of the embodiments are made with reference to the accompanying drawings, which are used to illustrate specific embodiments in which the present invention can be implemented. The directional terms mentioned in the present invention, such as "up", "down", "front", "rear", "left", "right", "inside", "outside", "side", etc. are only directions referring to the attached drawings. Therefore, the directional terms used are for explaining and understanding the present invention, but not for limiting the present invention. In the figures, similarly structured units are denoted by the same reference numerals.

For technical problems of an existing top-gate indium gallium zinc oxide (IGZO) semiconductor array substrate, after forming an active island, the active island is easily irradiated by light in subsequent processes, and a channel region of the active island is seriously affected by the light, which results in a large impact on performance of a thin film transistor (TFT) device. The present invention can solve the above technical problems.

An array substrate is provided as shown in FIG. 1. The array substrate includes a base substrate 11, an active island 14 disposed on the base substrate 11, a gate insulating layer 15 disposed on the active island 14, a gate 16 disposed on the gate insulating layer 15, and an interlayer dielectric layer 17 covering the active island 14, the gate insulating layer 15, and the gate 16.

The active island 14 may be an indium gallium zinc metal oxide semiconductor active island. The active island 14 includes a channel region 141 corresponding to the gate 16 and is located in an ion-doped region 142 disposed on both sides of the channel region 141.

Specifically, the array substrate further includes a source/drain 18 disposed on the interlayer dielectric layer 17, a passivation layer 19 covering the source/drain 18, a planarization layer 20 disposed on the passivation layer 19, and a metal anode 21 disposed on the planarization layer 20.

The source/drain 18 is in contact with an ion-doped region 142 of the active island 14 through a via hole on the interlayer dielectric layer 17, and the metal anode 21 is electrically connected to the source/drain electrodes.

The interlayer dielectric layer 17 is further provided with a color resist layer 22 disposed thereon, and the planarization layer 20 covers the color resist layer 22. An orthographic projection of the color resist layer 22 on the base substrate 11 covers an orthographic projection of the channel region 141 of the active island 14 on the base substrate 11.

The channel region 141 of the active island 14 is shielded by using the color resist layer 22. While the color resist layer 22 plays a normal blocking and filtering function, it can effectively prevent light from irradiating on the channel region 141 of the active island 14 in subsequent processes and lighting tests, thereby avoiding a bad influence on performance of a TFT device, and improving device stability and process stability.

Specifically, the array substrate has a display area, and the color resist layer 22 includes a color resist block 222 located in the display area and a light blocking layer 221 located above the active island 14. An orthographic projection of the light blocking layer 221 on the base substrate 11 covers the orthographic projection of the channel region 141 on the base substrate 11.

It should be noted that, the color resist block 222 is used for normal blocking and filtering of light, while the light blocking layer 221 is used to block the channel region 141 of the active island 14. The light blocking layer 221 and the color resist block 222 are formed by using the same material and process without affecting each other.

In one embodiment, a lateral size of the light blocking layer 221 is 4 to 20 μm greater than a lateral size of the channel region 141 of the active island 14. A vertical size of the light blocking layer 221 is 4 to 20 μm greater than a vertical size of the channel region 141 of the active island 14.

It should be noted that, in actual implementation, an orthographic projection of the light blocking layer 221 on the base substrate 11 may also be set to cover an orthographic projection of the active island 14 on the base substrate 11.

Specifically, the light blocking layer 221 includes a first color resist material layer and a second color resist material layer that are stacked on each other. A color corresponding to the first color resist material layer is one of red, green, and blue, and a color corresponding to the second color resist material layer is another one of red, green, and blue.

It should be noted that, those skilled in the art know that the red color resist material transmits red light and absorbs light of other colors. The green color blocking material transmits green light and absorbs light of other colors. The blue color blocking material transmits blue light and absorbs light of other colors.

The light blocking layer 221 is formed by stacking two color resist material layers, so as to play a better light shielding role.

It should be noted that, in actual implementation, the light blocking layer 221 may also have a single-layer structure, that is, it is formed of a color resist material of one color. The light blocking layer 221 may also be formed by stacking three color blocking material layers of different colors.

Specifically, the color resist block 222 includes a red color resist block, a blue color resist block, and a green color resist block.

A thickness of the light blocking layer 221 is the same as a thickness of the color resist block 222, so that a surface of the planarization layer 20 covering the light blocking layer 221 and the color resist block 222 is flatter.

Specifically, a first via hole 201 is provided on the planarization layer 20 at a position corresponding to the source/drain 18. The light blocking layer 221 is provided with a second via hole 2211 communicating with the first via hole 201. A third via hole 191 is formed on the passivation layer 19 and communicates with the second via hole 2211 and extends to a surface of the source/drain 18. The metal anode 21 is in contact with the source/drain 18 through the first via hole 201, the second via hole 2211, and the third via hole 191.

A hole diameter of the second via hole 2211 is greater than a hole diameter of the first via hole 201, so that the first via hole 201 communicating with the third via hole 191 is formed on the planarization layer 20.

In one embodiment, a pore diameter of the second via hole 2211 is 4-12 μm greater than a pore diameter of the first via hole 201.

In one embodiment, an axis line of the first via hole 201 is located on the same straight line as an axis line of the second via hole 2211 and an axis line of the third via hole 191.

In one embodiment, the array substrate further includes a light shielding layer 12 disposed on the base substrate 11 and a buffer layer 13 covering the light shielding layer 12. The light shielding layer 12 is disposed corresponding to the active island 14 to shield a bottom of the active island 14.

Figure 2:
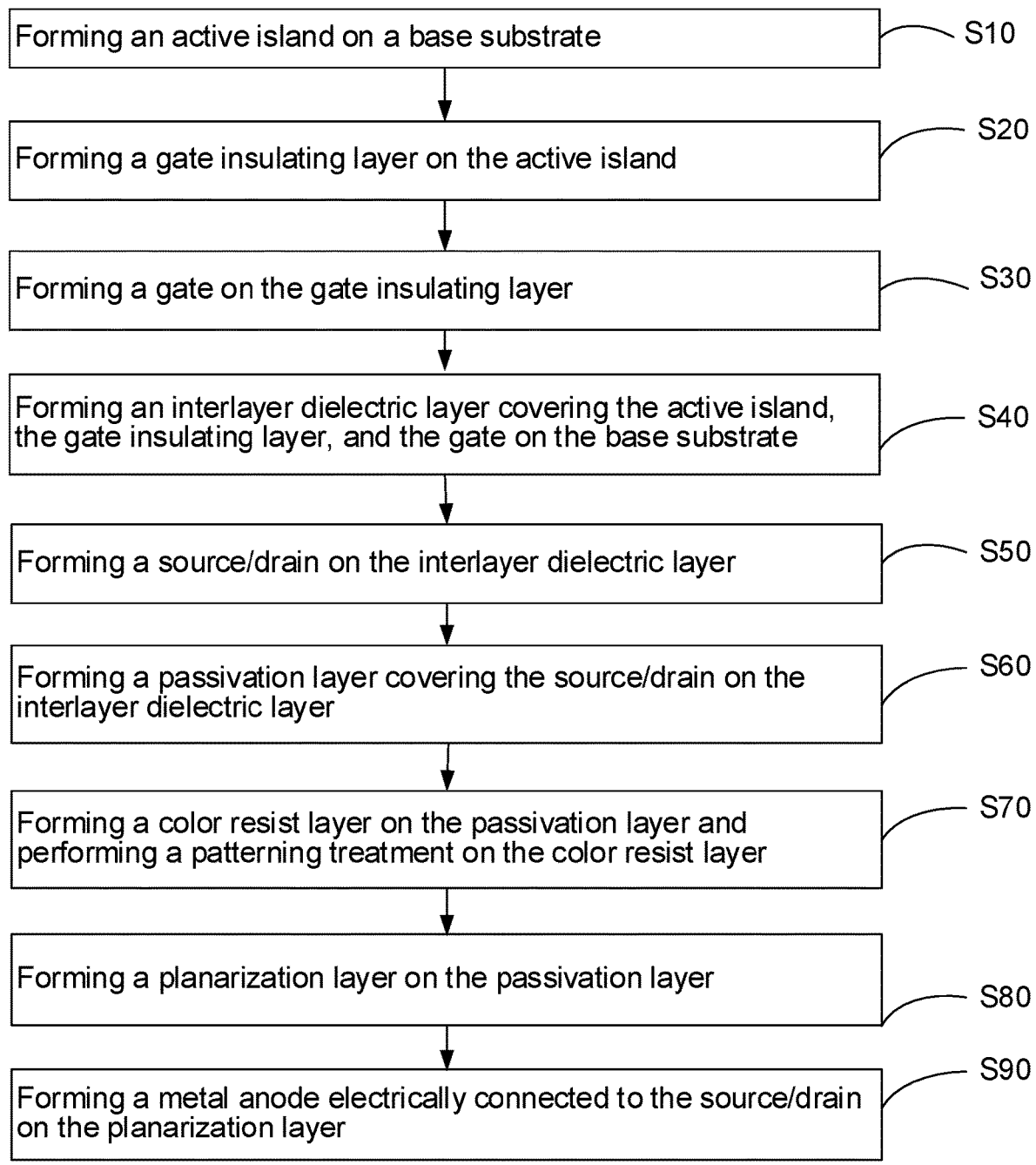
FIG. 2 is a schematic diagram of steps of manufacturing an array substrate according to an embodiment of the present invention.

Based on the above array substrate, an embodiment of the present invention also provides a method of manufacturing an array substrate. As shown in FIG. 2, the method includes the following steps:

S10, forming an active island 14 on a base substrate 11.

S20, forming a gate insulating layer 15 on the active island 14.

S30, forming a gate 16 on the gate insulating layer 15.

S40, forming an interlayer dielectric layer 17 covering the active island 14, the gate insulating layer 15, and the gate 16 on the base substrate 11.

S50, forming a source/drain 18 on the interlayer dielectric layer 17.

S60, forming a passivation layer 19 covering the source/drain 18 on the interlayer dielectric layer 17.

S70, forming a color resist layer 22 on the passivation layer 19 and performing a patterning treatment on the color resist layer 22.

S80, forming a planarization layer 20 on the passivation layer 19.

S90, forming a metal anode 21 electrically connected to the source/drain 18 on the planarization layer 20.

An orthographic projection of the color resist layer 22 on the base substrate 11 covers an orthographic projection of the channel region 141 of the active island 14 on the base substrate 11.

In details, the step S80 includes:

S81, forming a whole layer of the color resist layer 22 on the passivation layer 19.

S82, covering the color resist layer 22 with a photomask 23 and exposing the color resist layer 22.

S83, etching the color resist layer 22 to form a color resist block 222 located in the display area and a light blocking layer 221 above the active island 14, wherein an orthographic projection of the light blocking layer 221 on the base substrate 11 covers the orthographic projection of the channel region 141 of the active island 14 on the base substrate 11

It can be understood that the color resist block 222 includes a blue color resist block, a red color resist block, and a green color resist block. Different color resist blocks 222 are formed by coating different color resist materials. Each time a color resist material is applied, the color resist material layer is exposed once using the photomask 23 to form a color resist block 222 of a corresponding color.

The light blocking layer 221 includes a first color resist material layer and a second color resist material layer. A color corresponding to the first color resist material layer is one of red, green, and blue, and a color corresponding to the second color resist material layer is another one of red, green, and blue.

Further, a thickness of the light blocking layer 221 is the same as a thickness of the color resist block 222.

Specifically, in the step S83, when the color resist block 222 and the light blocking layer 221 are formed, a second via hole 2211 located on the light blocking layer 221 is simultaneously formed.

Specifically, when the color resist layer 22 is covered by the photomask 23, a first portion 231 of the photomask 23 corresponds to the light blocking layer 221, a second portion 232 of the photomask 23 corresponds to the color resist block 222, a third portion 233 of the photomask 23 corresponds to a second via hole 2211, light transmittance of the first portion 231 is greater than 0 and less than light transmittance of the second portion 232, and light transmittance of the third portion 233 is 0.

The color resist layer 22 is exposed by using the photomask 23 having a plurality of portions having different light transmittances, so that the color resist layer 22 can be made in the same process as the color resist block 222 and the second via hole 2211. This reduces preparation steps and saves production costs. In addition, light transmittance of the first portion 231 of the photomask 23 is less than light transmittance of the second portion 232, so that a thickness of the formed light blocking layer 221 is the same as a thickness of the color resist block 222. No additional processing is required for the light blocking layer 221.

In one embodiment, light transmittance of the first portion 231 of the photomask 23 is 30%, and light transmittance of the second portion 232 of the photomask 23 is 100%.

In an embodiment, before the step S10, the method of manufacturing the array substrate further includes: forming a light shielding layer 12 and a buffer layer 13 covering the light shielding layer 12 on the array substrate, wherein the active island 14 is disposed on the buffer layer 13, and the light shielding layer 12 is disposed corresponding to the active island 14.

Referring to FIG. 3 to FIG. 9, FIG. 3 to FIG. 9 are schematic diagrams of a manufacturing process of an array substrate according to an embodiment of the present invention.

Figure 3:
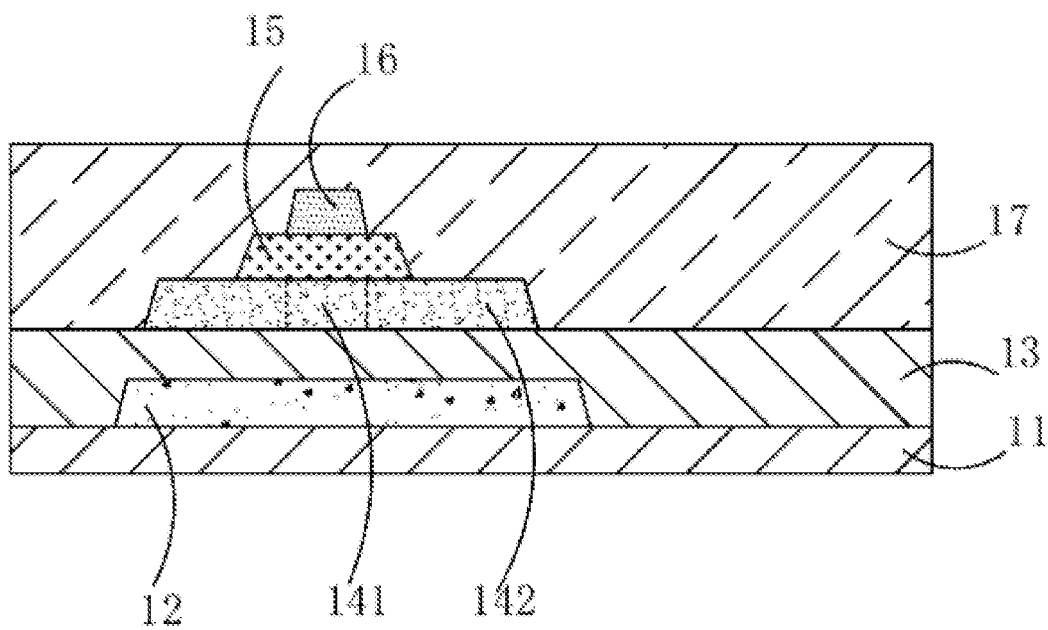
FIG. 3 to FIG. 9 are schematic diagrams of a manufacturing process of an array substrate according to an embodiment of the present invention.

As shown in FIG. 3, a light shielding layer 12 and a buffer layer 13 covering the light shielding layer 12 are sequentially formed on the base substrate 11. Subsequently, an active island 14, a gate insulating layer 15, and a gate 16 are stacked on the buffer layer 13 in order, and then an interlayer dielectric layer 17 is formed on the buffer layer 13 so as to cover the active island 14, the gate insulating layer 15, and the gate 16.

Figure 4:
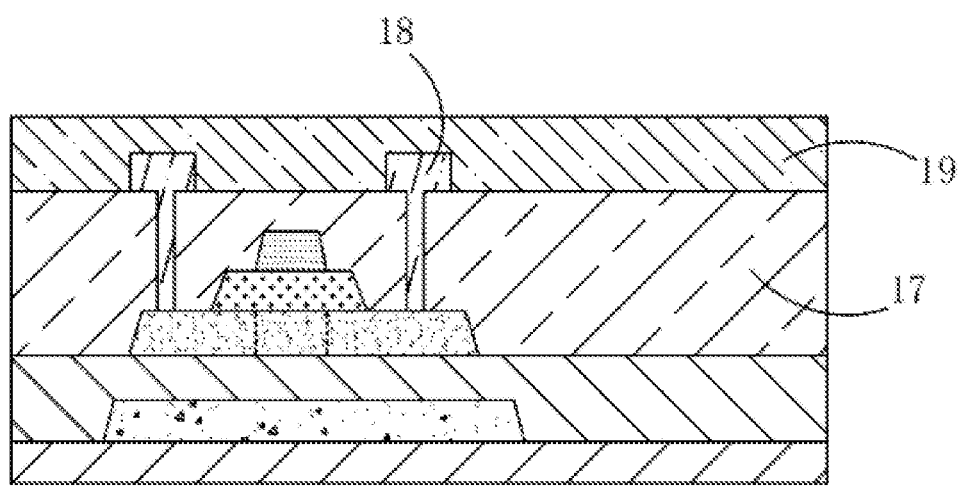

As shown in FIG. 4, a source/drain 18 electrically connected to an ion-doped region 142 of the active island 14 and a passivation layer 19 covering the source/drain 18 are formed on the interlayer dielectric layer 17.

Figure 5:
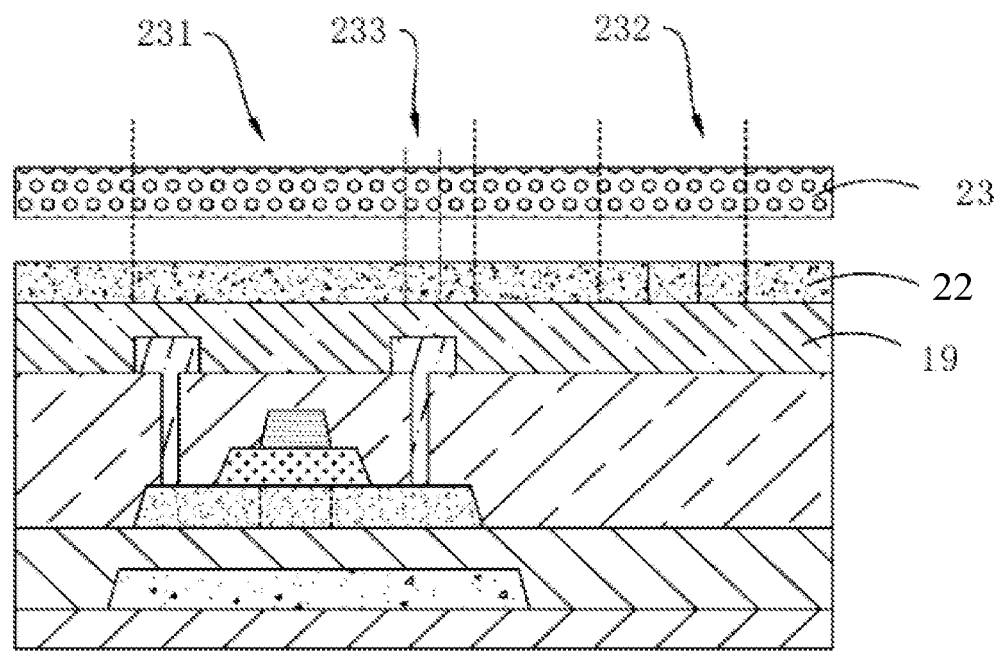

As shown in FIG. 5, a color resist layer 22 covering an entire surface is formed on the passivation layer 19. After the color resist layer 22 is shielded by a photomask 23, the color resist layer 22 is exposed.

Figure 6:
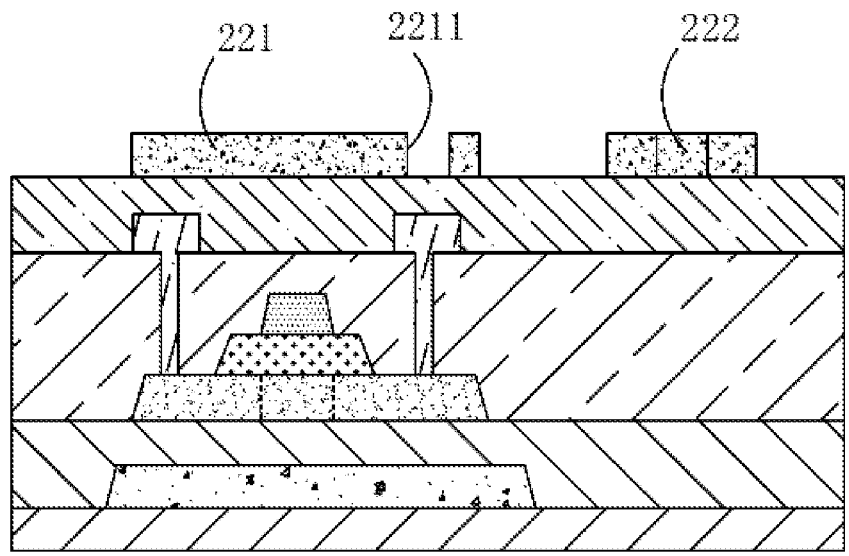

As shown in FIG. 6, the color resist layer 22 is etched to form a light blocking layer 221 and a color resist block 222 that are independent of each other, and a second via hole 2211 is formed on the light blocking layer 221 and penetrates the light blocking layer 221.

Figure 7:
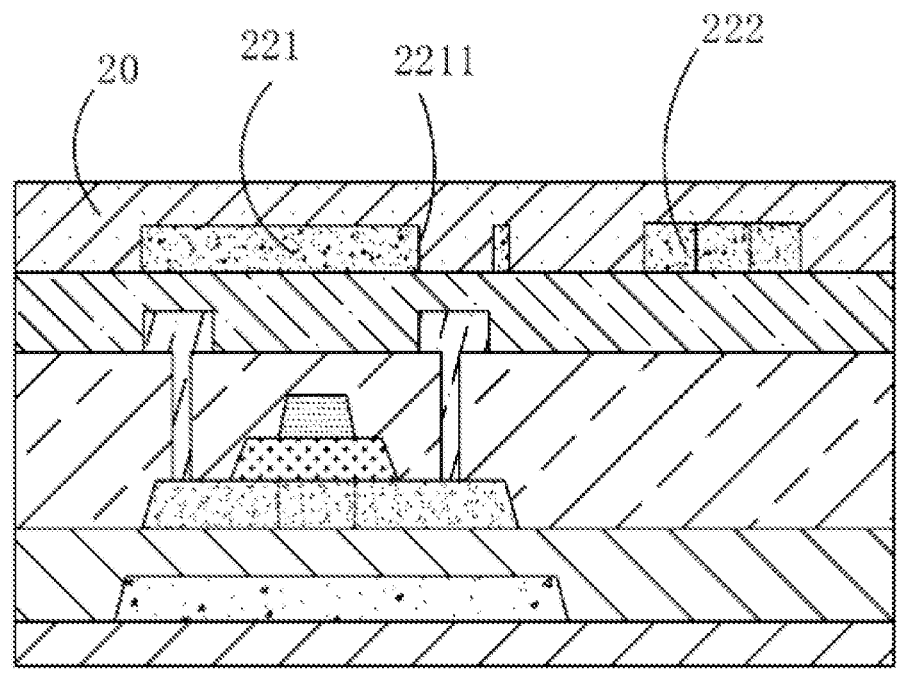

As shown in FIG. 7, a planarization layer 20 is formed to cover the light blocking layer 221 and the color resist block 222. The second via hole 2211 is filled by the planarization layer 20.

Figure 8:
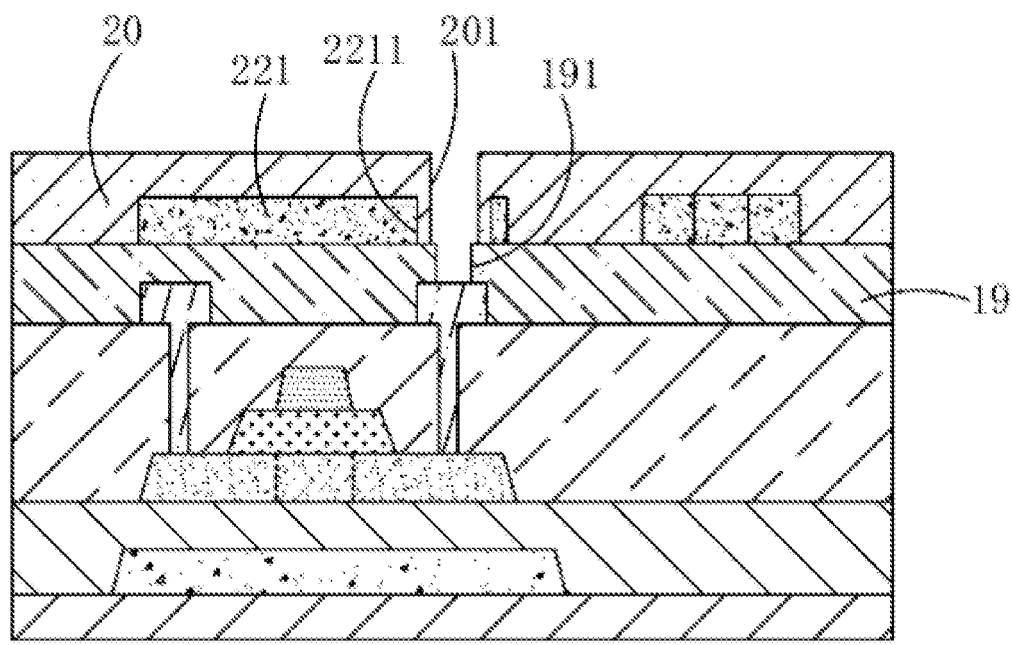

As shown in FIG. 8, an etching process is performed on a region corresponding to the second via hole 2211 on the planarization layer 20. After the first via hole 201 extending to a surface of the passivation layer 19 is formed, a region corresponding to the first via hole 201 of the passivation layer 19 is etched to form a third via hole 191 extending to a surface of the source/drain 18.

Figure 9:
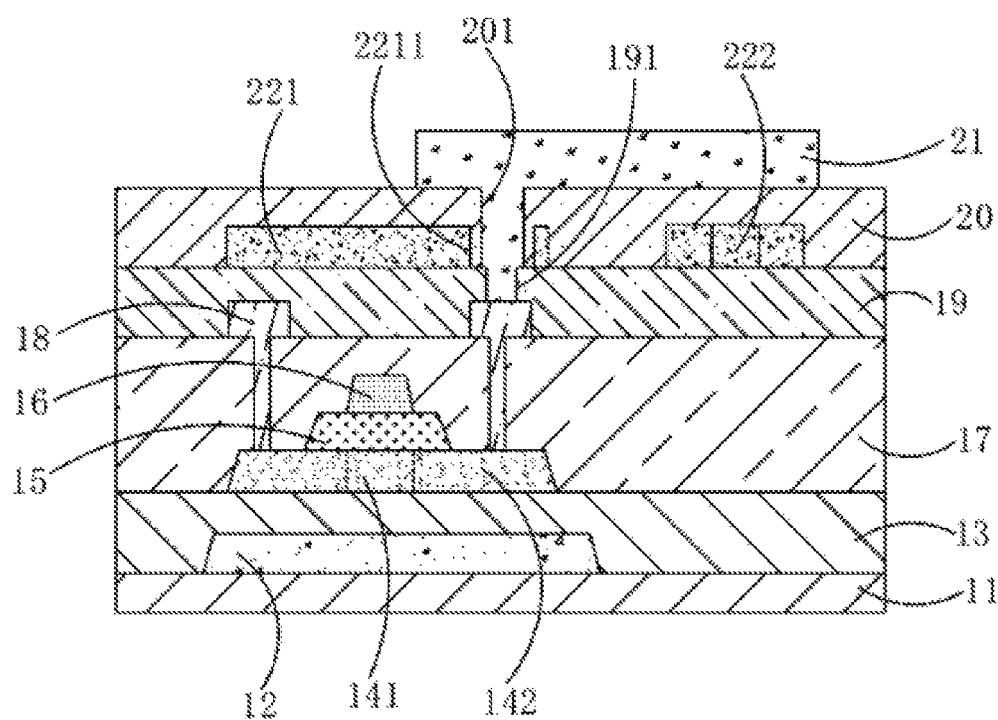

As shown in FIG. 9, a metal anode 21 filled with a first via hole 201 and a third via hole 191 is formed on the planarization layer 20. The metal anode 21 is electrically connected to the source/drain 18.

Beneficial effects of the present application are that: the color resist layer 22 is used to shield a channel of the active island 14. While the color resist layer 22 plays a normal role of blocking and filtering, it can effectively prevent light from shining on the channel region 141 of the active island 14 in subsequent processes and lighting tests, so as to avoid adversely affecting performance of a TFT device, device stability and process stability are improved.

In summary, although the present invention has been disclosed as above with preferred embodiments, the above preferred embodiments are not intended to limit the present invention. Those skilled in the art can make various modifications and retouching without departing from the spirit and scope of the present invention. Therefore, the protection scope of the present invention is subject to the scope defined by the claims.

What is claimed is:

1. An array substrate, comprising:
   a base substrate;
   an active island disposed on the base substrate;
   a gate insulating layer disposed on the active island;
   a gate disposed on the gate insulating layer;
   an interlayer dielectric layer covering the active island, the gate insulating layer, and the gate;
   a source/drain disposed on the interlayer dielectric layer, wherein the source/drain is in contact with the active island through a via hole on the interlayer dielectric layer;
   a passivation layer covering the source/drain;
   a color resist layer disposed on the passivation layer;
   a planarization layer disposed on the passivation layer; and
   a metal anode disposed on the planarization layer and electrically connected to the source/drain, wherein the active island comprises a channel region corresponding to the gate, and an orthographic projection of the color resist layer on the base substrate covers an orthographic projection of the channel region of the active island on the base substrate;
   wherein the array substrate is further provided with a display area, the color resist layer comprises a color resist block located in the display area and a light blocking layer located above the active island, and an orthographic projection of the light blocking layer on the base substrate covers the orthographic projection of the channel region on the base substrate; and
   wherein the light blocking layer comprises a first color resist material layer and a second color resist material layer which are arranged in a stack, a color corresponding to the first color resist material layer is one selected from red, green, and blue, and a color corresponding to the second color resist material layer is another one in red, green, and blue.

2. The array substrate according to claim 1, wherein a thickness of the light blocking layer is same as a thickness of the color resist block.

3. The array substrate according to claim 1, wherein a thickness of the light blocking layer is same as a thickness of the color resist block.

4. The array substrate according to claim 1, wherein the planarization layer covers the light blocking layer, a first via hole is provided through the planarization layer at a position corresponding to the source/drain, the light blocking layer is provided with a second via hole communicating with the first via hole, the passivation layer is provided with a third via hole communicating with the second via hole and a surface of the source/drain, and the metal anode contacts the source/drain through the first via hole, the second via hole, and the third via hole.

5. The array substrate according to claim 4, wherein a diameter of the second via hole is greater than a diameter of the first via hole.

6. An array substrate, comprising:
   a base substrate;
   an active island disposed on the base substrate;
   a gate insulating layer disposed on the active island;
   a gate disposed on the gate insulating layer;
   an interlayer dielectric layer covering the active island, the gate insulating layer, and the gate;

a source/drain disposed on the interlayer dielectric layer;
a passivation layer covering the source/drain;
a color resist layer disposed on the passivation layer;
a planarization layer disposed on the passivation layer; and
a metal anode disposed on the planarization layer and electrically connected to the source/drain, wherein the active island comprises a channel region corresponding to the gate, and an orthographic projection of the color resist layer on the base substrate covers an orthographic projection of the channel region of the active island on the base substrate;
wherein the array substrate further provides with a display area, the color resist layer comprises a color resist block located in the display area and a light blocking layer located above the active island, and an orthographic projection of the light blocking layer on the base substrate covers the orthographic projection of the channel region on the base substrate; and
wherein the light blocking layer comprises a first color resist material layer and a second color resist material layer arranged in a stack, a color corresponding to the first color resist material layer is one selected from red, green, and blue, and a color corresponding to the second color resist material layer is another one in red, green, and blue.

7. The array substrate according to claim 6, wherein the planarization layer covers the light blocking layer, a first via hole is provided through the planarization layer at a position corresponding to the source/drain, the light blocking layer is provided with a second via hole communicating with the first via hole, the passivation layer is provided with a third via hole communicating with the second via hole and extending to a surface of the source/drain, and the metal anode contacts the source/drain through the first via hole, the second via hole, and the third via hole.

8. The array substrate according to claim 7, wherein a diameter of the second via hole is greater than a diameter of the first via hole.

9. A method of manufacturing an array substrate, comprising following steps:
S10, forming an active island on a base substrate;
S20, forming a gate insulating layer on the active island;
S30, forming a gate on the gate insulating layer;
S40, forming an interlayer dielectric layer covering the active island, the gate insulating layer, and the gate on the base substrate;
S50, forming a source/drain on the interlayer dielectric layer;
S60, forming a passivation layer covering the source/drain on the interlayer dielectric layer;
S70, forming a color resist layer on the passivation layer and performing a patterning treatment on the color resist layer;
S80, forming a planarization layer on the passivation layer; and
S90, on the planarization layer, forming a metal anode electrically connected to the source/drain, wherein an orthographic projection of the color resist layer on the base substrate covers an orthographic projection of a channel region of the active island on the base substrate, wherein the step S80 further comprises:
S81, forming a whole layer of the color resist layer on the passivation layer;
S82, covering the color resist layer with a photomask and exposing the color resist layer; and
S83, etching the color resist layer to form a color resist block located in a display area and a light blocking layer located above the active island, wherein an orthographic projection of the light blocking layer on the base substrate covers the orthographic projection of the channel region of the active island on the base substrate.

10. The method of manufacturing the array substrate according to claim 9, wherein in the step S83, the color resist block and the light blocking layer are formed simultaneously with a second via hole located on the light blocking layer.

* * * * *